United States Patent
Chung

(10) Patent No.: US 7,238,982 B2
(45) Date of Patent: Jul. 3, 2007

(54) SPLIT GATE TYPE FLASH MEMORY DEVICE AND METHOD FOR MANUFACTURING SAME

(75) Inventor: Jin-kuk Chung, Incheon Metroplican (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 11/153,392

(22) Filed: Jun. 16, 2005

(65) Prior Publication Data
US 2005/0281125 A1    Dec. 22, 2005

(30) Foreign Application Priority Data
Jun. 16, 2004    (KR) .................. 10-2004-0044493

(51) Int. Cl.
*H01L 29/788*    (2006.01)
(52) U.S. Cl. ............... 257/316; 257/E29.129; 257/E29.3; 257/E21.422; 257/E21.68
(58) Field of Classification Search ................ 257/316, 257/E29.129, E29.3, E21.422, E21.68
See application file for complete search history.

(56) References Cited
U.S. PATENT DOCUMENTS
4,998,220 A * 3/1991 Eitan et al. ............ 365/185.14

| | | | |
|---|---|---|---|
| 6,093,951 A * | 7/2000 | Burr | 257/408 |
| 6,121,666 A * | 9/2000 | Burr | 257/408 |
| 6,124,609 A * | 9/2000 | Hsieh et al. | 257/315 |
| 6,157,058 A * | 12/2000 | Ogura | 257/315 |
| 6,214,741 B1 | 4/2001 | Lee | |
| 6,323,085 B1 * | 11/2001 | Sandhu et al. | 438/257 |
| 7,166,888 B2 * | 1/2007 | Bhattacharyya | 257/316 |
| 2006/0019444 A1 * | 1/2006 | Lu et al. | 438/257 |

FOREIGN PATENT DOCUMENTS
JP        11-214546        8/1999
KR      1998-048947        9/1998

* cited by examiner

Primary Examiner—Ngân V. Ngô
(74) Attorney, Agent, or Firm—Volentine & Whitt, PLLC

(57) ABSTRACT

A split gate type flash memory device and a method of manufacturing the split gate type flash memory device are disclosed. The split gate type flash memory device includes a silicon epitaxial layer formed in an active region of a bulk silicon substrate and a disturbance-preventing insulating film formed in the bulk silicon substrate between a source region and a drain region of the device. According to selected embodiments of the invention, the disturbance-preventing insulating film is formed using a Shallow Trench Isolation (STI) forming process.

11 Claims, 5 Drawing Sheets

SPLIT GATE TYPE FLASH MEMORY DEVICE AND METHOD FOR MANUFACTURING SAME

BACKGROUND OF THE INVENTION

1. Field of the Invention

The present invention relates to a nonvolatile semiconductor memory device and a method for manufacturing the same. More particularly, the present invention relates to a split gate type flash memory device and a related method for manufacture.

A claim of priority is made to Korean Patent Application No. 10-2004-0044493 filed on Jun. 16, 2004, the disclosure of which is hereby incorporated by reference in its entirety.

2. Description of the Related Art

Electrically erasable and programmable nonvolatile semiconductor memory devices are a popular choice for many modern electronic devices, including mobile communication systems, memory cards and the like. For example, Electrically-Erasable Programmable Read Only Memory (EEPROM) is commonly used to store data in cellular phones and in digital camera memory cards. Flash memory, which is a type of EEPROM, may be programmed one cell at a time, but erased in block or sector units comprising multiple memory cells. Flash memory devices typically include one transistor having a floating gate and another transistor having an electron trap layer. Examples of transistors having a floating gate include stacked gate transistors, split gate transistors, and the like.

FIG. 1A is a schematic showing a planar view of a conventional flash memory device having a split gate transistor (referred to hereafter as "split gate type flash memory device"). FIG. 1B is a schematic showing a cross-sectional view taken along a line between X and X' in FIG. 1A. FIG. 1B shows a pair of memory cells.

Referring to FIGS. 1A and 1B, a semiconductor substrate 10 has an active region 11 defined by a device isolation region 13. Device isolation region 13 typically comprises a shallow trench isolation (STI) film. In addition, the split gate type flash memory device has a source region 15 formed in semiconductor substrate 10. Source region 15 is formed in a predetermined portion of active region 11. Source region 15 is a common source for the pair of memory cells shown in FIG. 1B. Source region 15 is extended in length together with a horizontally adjacent source region 15 to form a common source line.

A pair of floating gates 20 is formed on semiconductor substrate 10 adjacent to both sides of source region 15. Each floating gate 20 has an upper surface covered by an inter-gate insulating film 25. At least one sidewall of floating gate 20 is covered by a control gate 30. Control gate 30 extends from the sidewall of floating gate 20 to cover the upper surface of inter-gate insulating film 25, and to cover a portion of semiconductor substrate 10 disposed adjacent to floating gate 20 and on the distal sides of floating gate 20 relative to source region 15. Control gate 30 extends horizontally to be parallel with the common source line. The horizontally extended control gate 30 functions as a word line.

A drain region 35 is formed in semiconductor substrate 10 adjacent to each control gate 30. A portion of each drain region 35 is typically overlapped by control gates 30. Each drain region 35 is connected with a bit line (not shown) through a contact. A coupling insulating film 40 is formed between each floating gate 20 and semiconductor substrate 10. Coupling insulating film 40 extends down each floating gate 20 and is overlapped, at least in part, by a tunneling insulating film 45 extending over the sidewall of floating gate 20 covered by control gates 30. Tunneling insulating film 45 is patterned according to the shape of control gate 30. Coupling insulating film 40 and tunneling insulating film 45, both of which are formed below control gates 30, function collectively as a gate insulating film for the resulting MOS transistor.

The split gate type flash memory device typically further includes spacers 50 formed on sidewalls of control gate 30, on a sidewall of each floating gate 20 and on a proximal portion of inter-gate insulating film 25 relative to source region 15. Spacers 50 are not essential structural elements, but are typically formed in cases where flash memory devices are merged with the logic devices.

The split gate type flash memory device has a structure wherein each floating gate 20 is isolated from a respective control gate 30. As such, floating gate 20 is electrically insulated. The split gate type flash memory device stores data using various techniques that manipulate cell current, such as electron injection (programming) and electron emission (erasing).

In a case where a programming operation is performed with respect to only a single selected cell, a high voltage, e.g., more than 9V, is typically applied to source region 15, and an appropriate voltage (VD1) such as 0V is applied to drain region 35. Additionally, a voltage at least as high as a threshold voltage (VG1) is applied to control gate 30 of the selected cell, and a voltage of 0V is applied to control gate 30 of the non-selected cell. In this case, hot electrons are injected into floating gate 20 through coupling insulating film 40 in semiconductor substrate 10 down floating gate 20 adjacent to control gate 30 in the selected cell. However, this result does not occur in the non-selected cell.

Unfortunately, the split gate type flash memory device suffers from a problem related to the programming operation. The problem, known as the "disturbance problem", is experienced in the non-selected cell during programming of the selected cell. The disturbance problem is caused, at least in part, by the high voltage applied to source region 15 during programming and more particularly to the portion of source region 15 overlapped by floating gate 20. To be more specific, even though the threshold voltage is not applied to the control gate 30 of the non-selected cell, a depletion area extends toward both sides of source region 15 as a result of the high voltage applied to source region 15. Furthermore, there is an effect in which a certain voltage appears to be applied to floating gate 20 in the non-selected cell. As a result, the depletion area extends through semiconductor substrate 10 down a channel region in the non-selected cell and generates a punch-through, thereby causing the non-selected cell to be programmed together with the selected cell.

SUMMARY OF THE INVENTION

The present invention provides a split gate type flash memory device and a related method of manufacture in which the disturbance problem between selected and non-selected memory cells sharing a common source region is prevented.

According to one embodiment of the present invention, a split gate type flash memory device comprises a bulk silicon substrate having an active region defined by a device-isolating insulating film. A silicon epitaxial layer is formed on the bulk silicon substrate. The silicon epitaxial layer is typically formed only in the active region of the bulk silicon substrate. Additionally, a source region and a drain region are formed in the bulk silicon substrate and the silicon epitaxial layer, and a channel region is defined in the silicon epitaxial layer between the source region and the drain region.

The flash device further comprises a disturbance-preventing insulating film formed in the bulk silicon substrate between the source region and the drain region. The source region and the drain region of the bulk silicon substrate are typically isolated from each other by the disturbance-preventing insulating film. The disturbance-preventing insulating film is typically connected with the device-isolating insulating film.

In selected embodiments of the invention, other structural elements in the flash device are typically the same as those used in a conventional split gate type flash memory device. For example, the flash device may include a coupling insulating film formed on the silicon epitaxial layer, a floating gate formed on the coupling insulating film overlapping an outer portion of the source region, a control gate overlapping a portion of the floating gate opposite to the source region, and extended toward the drain region, an inter-gate insulating film formed between the floating gate and the control gate, and a tunneling insulating film interposed between the floating gate and the control gate.

According to another embodiment of the present invention, a method of manufacturing a split gate type flash memory device is provided. The method comprises forming a device-isolating insulating film defining an active region in a bulk silicon substrate and a disturbance-preventing insulating film in the active region. The device-isolating insulating film and the disturbance-preventing insulating film are typically formed concurrently. The method further comprises forming a silicon epitaxial layer on the active region of the bulk silicon substrate. The silicon epitaxial layer is a material layer functioning as a channel region in a split gate transistor.

In selected embodiments of the invention, subsequent processes generally comprise conventional techniques applied to manufacture of flash devices. For example, a thermal oxidation process may be used to form a coupling insulating film on the exposed bulk silicon substrate having the silicon epitaxial layer formed thereon. A floating gate may then be formed on the coupling insulating film. In a related aspect, a portion of the floating gate may overlap the disturbance-preventing insulating film.

The thermal oxidation process and chemical vapor deposition may be further used to form a silicon oxide film to act as a tunneling insulating film on at least a sidewall of the floating gate. An ion implantation process may then be used to form a source region overlapping with a portion of the floating gate in the active region of the bulk silicon substrate and the silicon epitaxial layer. A control gate overlapping a portion of the floating gate may then be formed such that the inter-gate insulating film and the tunneling insulating film are interposed between the control gate and the portion of the floating gate. A drain region may be formed in the silicon epitaxial layer and the active region of the bulk silicon substrate opposite to the source region with respect to the disturbance-preventing insulating film. Alternatively, the source region and the drain region may be formed using a conventional processing sequence. A spacer may be formed on sidewalls of the control gate and on the tunneling insulating film of the floating gate toward the source region.

BRIEF DESCRIPTION OF THE DRAWINGS

The invention is described below in relation to several selected embodiments illustrated in the accompanying drawings. Throughout the drawings the thickness of various layers has been exaggerated for clarity and like reference numerals are used to indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 2A:
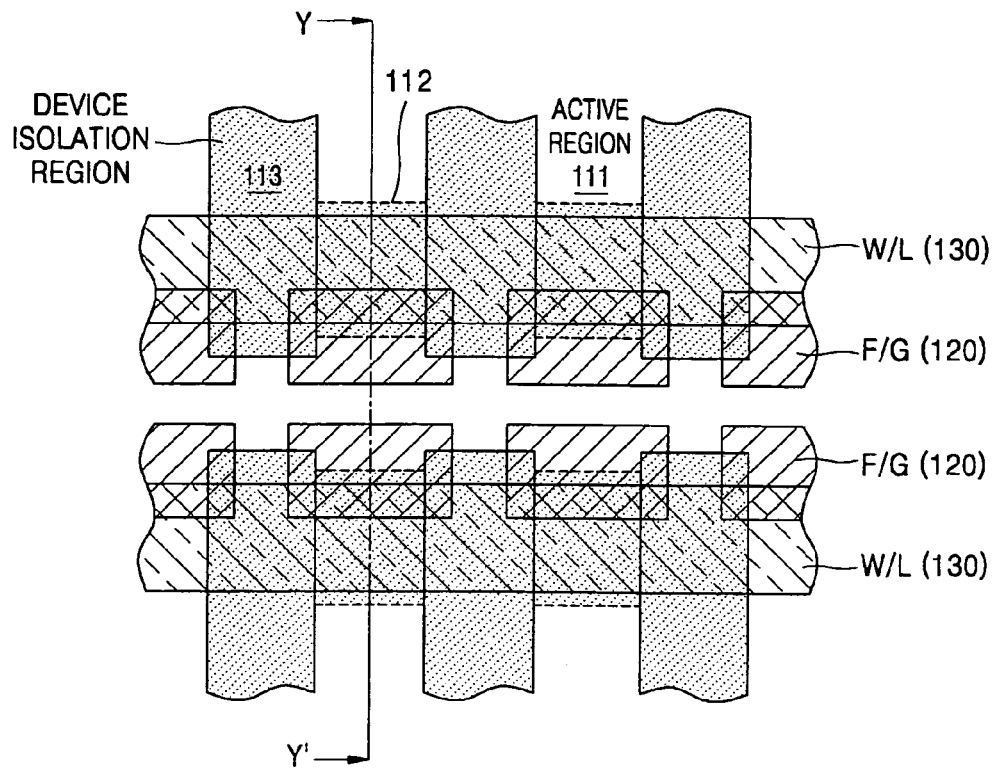
FIG. 2A is a planar view illustrating a memory cell array for a split gate type flash memory device according to one embodiment of the present invention.
Figure 2B:
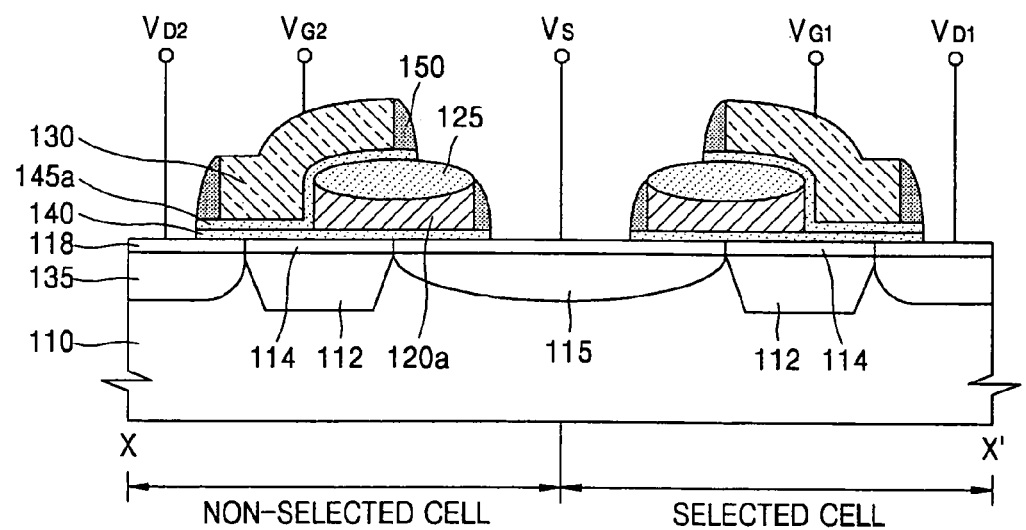
FIG. 2B is a schematic showing a cross-sectional view taken along a line between Y and Y' in FIG. 2A.

FIG. 2A is a planar view illustrating a memory cell array for a split gate type flash memory device according to one embodiment of the present invention. FIG. 2B is a schematic cross-sectional view taken along a line between Y and Y' in FIG. 2A.

Figure 1A:
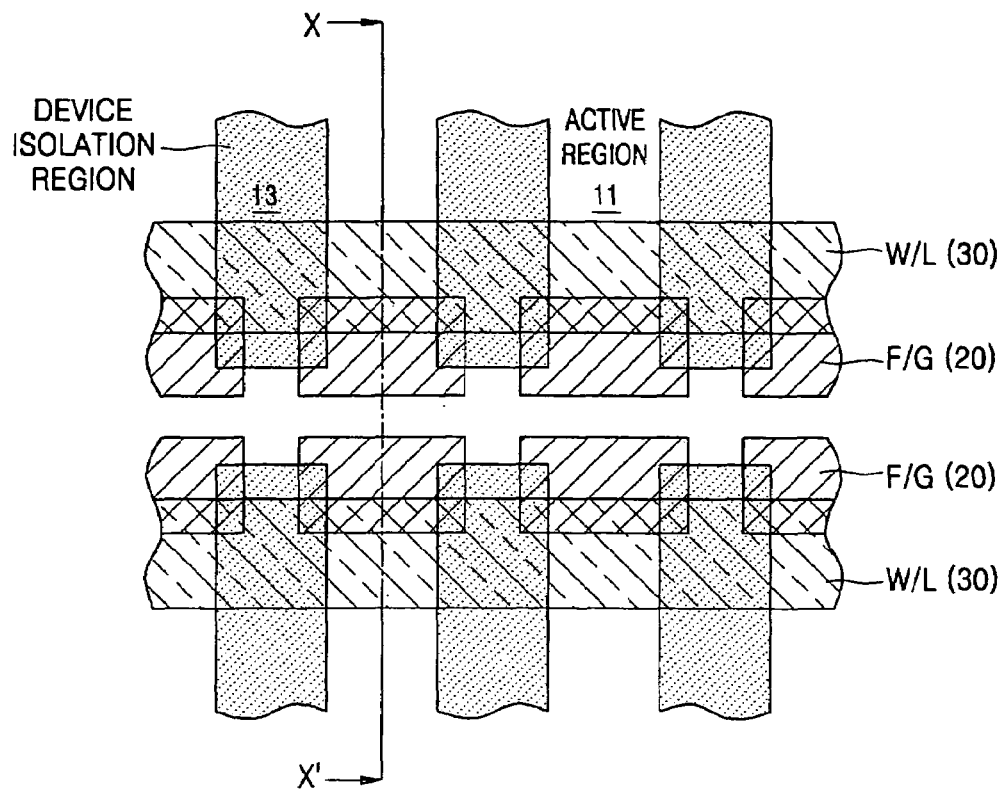
FIG. 1A is a planar view illustrating a memory cell array for a conventional split gate type flash memory device.
Figure 1B:
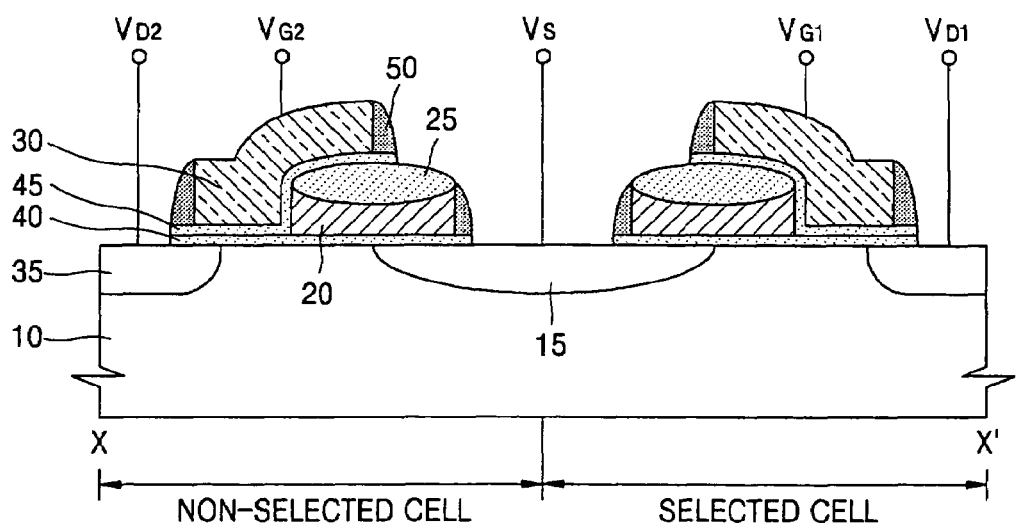
FIG. 1B is a schematic showing a cross-sectional view taken along a line between X and X' in FIG. 1A.

Referring to FIGS. 2A and 2B, an active region 111 is defined in a bulk silicon substrate 110 by a device isolation region 113 having, for example, the same layout as the conventional device isolation region 13 described with reference to FIG. 1. Bulk silicon substrate 110 is one example of a semiconductor substrate that could be used to form the memory cell array for the split gate type flash memory device. Device isolation region 113 is typically formed of a rectangular device-isolating film arrayed vertically and horizontally. Active region 111 is formed in bulk silicon substrate 110 between the device-isolating insulating films, which are horizontally parallel to one another. A split gate transistor is formed in active region 111. The device-isolating insulating film may be formed by a Shallow Trench Isolation (STI) film.

A disturbance-preventing insulating region 112 is formed in active region 111 of bulk silicon substrate 110. In one embodiment, disturbance-preventing insulating region 112 is formed at least partially beneath a channel region 114 (described later) of the split gate transistor to prevent punch-through between a source region 115 and a drain region 135 of a non-selected cell during a programming operation. Disturbance-preventing insulating region 112 may be formed of an insulating material such as silicon oxide, silicon nitride, silicon oxide nitride, or a combination thereof. Disturbance-preventing insulating region 112 is preferably formed of the same material as device isolation region 113.

As described above, disturbance-preventing insulating region 112 prevents punch-through. In order to prevent punch-through, selected embodiments of the present invention use a disturbance-preventing insulating region 12 formed in bulk silicon substrate 110 beneath the channel region to completely isolate source region 115 and drain region 135 from each other. Accordingly, disturbance-preventing insulating region 112 may in selected embodiments be connected to device isolation region 113, which is horizontally adjacent thereto and generally has a depth sufficient to prevent punch-through.

Following formation of disturbance-preventing insulating region 112, a silicon epitaxial layer 118 is formed on bulk silicon substrate 110. Preferably, silicon epitaxial layer 118 is formed on active region 111, but not on device isolation region 113. Silicon epitaxial layer 118 functions as a channel region in the split gate transistor, and hence its thickness varies depending on the design rule and intended operating characteristics of the ultimate device.

Source region 115 and drain region 135 are selectively formed in predetermined regions of active region 111 in bulk silicon substrate 110 and silicon epitaxial layer 118. In a case where a p-type bulk silicon substrate 110 is used, n-type impurity ions such as phosphorus (P) or arsenic (As) are selectively implanted to form source region 115 and drain region 135. Source region 115 acts as a common source for a pair of memory cells, and horizontally extends to form a common source line. Within the context of selected embodiments of the invention, source region 115 and drain region 135 are electrically isolated from each other by disturbance-preventing insulating region 112 within bulk silicon substrate 110. However, in silicon epitaxial layer 118, source region 115 and drain region 135 are merely spaced apart from each other and not electrically isolated from each other. The portion of silicon epitaxial layer 118 between source region 115 and drain region 135 forms channel region 114 of the split gate transistor.

A floating gate (F/G) 120a is formed on a coupling insulating film 140 such that coupling insulating film 140 is interposed between silicon epitaxial layer 118 and floating gate 120a. Floating gate 120a is typically formed of polysilicon, and coupling insulating film 140 is typically formed of silicon oxide. A portion of floating gate 120a overlaps source region 115. Additionally, coupling insulating film 140 extends to cover a first portion of source region 115 and an portion of channel region 114 and yet expose an second portion of source region 115 and drain region 135 for an electrical connection with an external circuit. Additionally, an inter-gate insulating film 125 is typically formed on floating gate 120a.

A control gate 130 overlaps a portion of floating gate 120a with tunneling insulating film 145a is interposed between the two. Control gate 130 is typically formed of a conductive material such as polysilicon, metal, or the like. Tunneling insulating film 145a is typically formed of a silicon oxide. Control gate 130 overlaps a portion of floating gate 120a closest to drain region 135, and is extended toward drain region 135. Control gate 130 is connected with a control gate of a horizontally adjacent memory cell so as to function as a word line (W/L) for the flash memory device. Tunneling insulating film 145a may be formed to have a shape resembling the shape of control gate 130. Tunneling insulating film 145a and inter-gate insulating film 125 are interposed between a portion of control gate 130 and an upper surface of floating gate 120a. Only tunneling insulating film 145a is interposed between control gate 130 and a sidewall of floating gate 120a toward drain region 135. Additionally, coupling insulating film 140 and tunneling insulating film 145a are interposed between a remaining portion of control gate 130 and silicon epitaxial layer 118. Coupling insulating film 140 and tunneling insulating film 145a function as a gate insulating film for the split gate transistor.

A spacer 150 typically formed on a sidewall of control gate 130 and on a sidewall of floating gate 120a nearest source region 115. Spacer 150 is not an essential structural element of the split gate type flash device. However, in cases where the split gate type flash device is merged with the logic device in one semiconductor substrate, spacer 150 is generally formed. Where used, spacer 150 may readily be formed by a process used to form the related logic device. Spacer 150 is generally formed of silicon nitride.

The split gate type flash device illustrated in FIG. 2 does not generate a disturbance. For example, suppose that programming is performed in a selected cell of FIG. 2B. In this case, a high voltage, for example, about 9V, is applied to source region 115 (Vs) and a threshold voltage is applied to control gate 130 (VG1) in the selected cell. A voltage is not applied to control gate 130 (VG2) in the non-selected cell. Additionally, a voltage of 0V is applied to drain region 135 (VD1 and VD2) from an external source. Due to device characteristics, a voltage of about 0.4V can be applied to drain region 135. As described previously in relation to FIG. 1, in the conventional flash device, a high voltage applied to the source region and a voltage associated with the floating gate coupled to the source region may cause punch-through down the channel region. However, the present invention forms disturbance-preventing insulating film 112 in bulk silicon substrate 110 down channel region 114, thereby preventing the punch-through from occurring.

Referring to FIGS. 3 through 7, a method of manufacturing a split gate type flash memory device is described according to one embodiment of the present invention. The exemplary method shown in FIGS. 3 through 7 will be described with reference to the split gate type flash memory device shown in FIG. 2B.

Figure 3A:
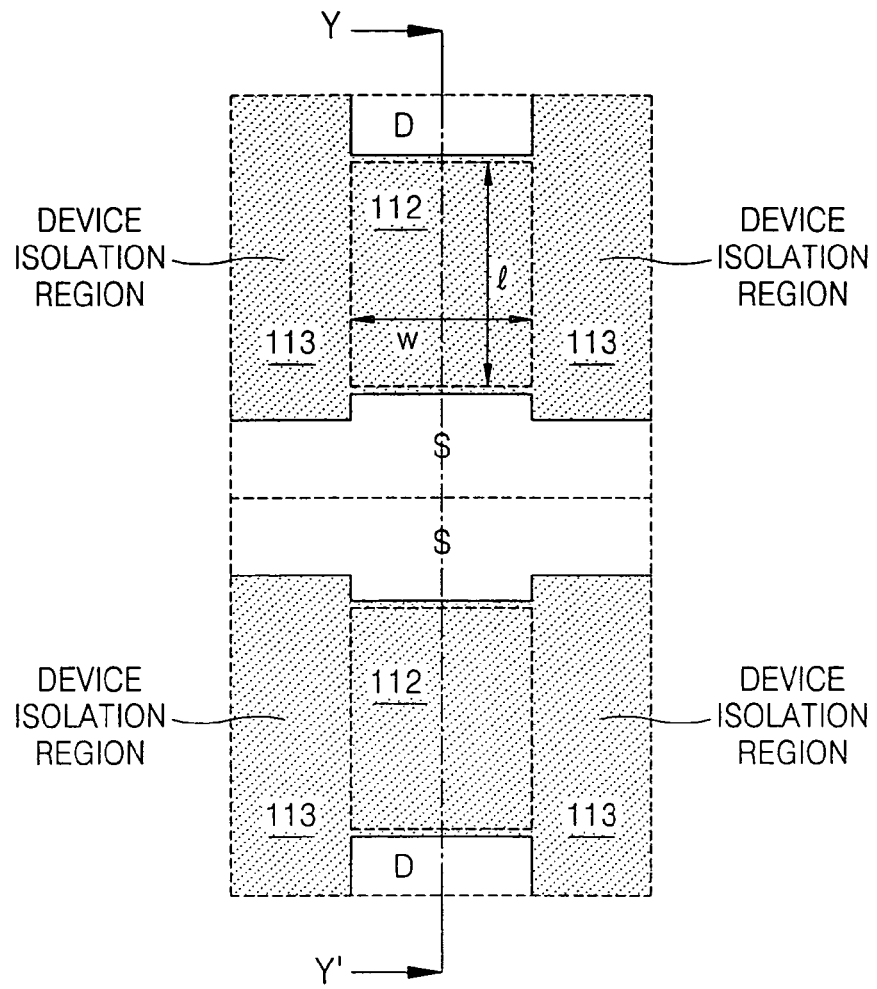
FIG. 3A is a planar view illustrating a layout of a STI film and a disturbance-preventing insulating film for one pair of memory cells.
Figure 3B:
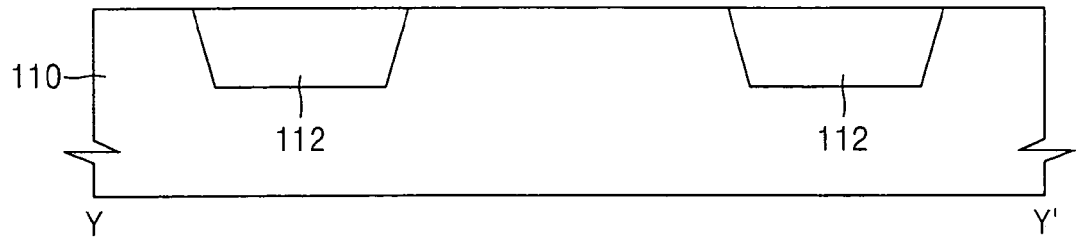
FIG. 3B is a schematic showing a cross-sectional view taken along a line between Y and Y' in FIG. 3A; and, FIGS. 4 through 7 are schematics showing cross-sectional views illustrating a method of manufacturing a split gate type flash memory device.

Referring to FIGS. 3A and 3B, device-isolating insulating film and disturbance-preventing insulating region 112 are formed on bulk silicon substrate 110. Device isolation region 113 and disturbance-preventing insulating region 112 are generally formed concurrently using a conventional STI forming process. In order to do so, bulk silicon substrate 110 is etched to form a pattern of trenches. The pattern of trenches is formed in device isolation region 113 and in a portion of active region 111. A first trench is formed in a portion of active region 111 corresponding to the channel region of the split gate transistor, i.e. a portion indicated by numeral 112 in FIG. 3A. The first trench has a length (l) which is typically the same as or less than a distance between the source region "S" (115 in FIG. 2B) and the drain region "D" (135 in FIG. 2B). In addition, the first trench has a width (W) which is the same as a width of the channel region. Hence, the trench is typically connected to a second trench used to form a STI film in device isolation region 113. After the first trench is formed, a silicon oxide film, a silicon nitride film, a silicon oxide nitride film, or a combination thereof is used to fill the trench in the same manner as in the conventional STI forming process. As a result, active region 111 is defined by device isolation region 113 and disturbance-preventing insulating film 112 is formed in active region 111.

Figure 4:
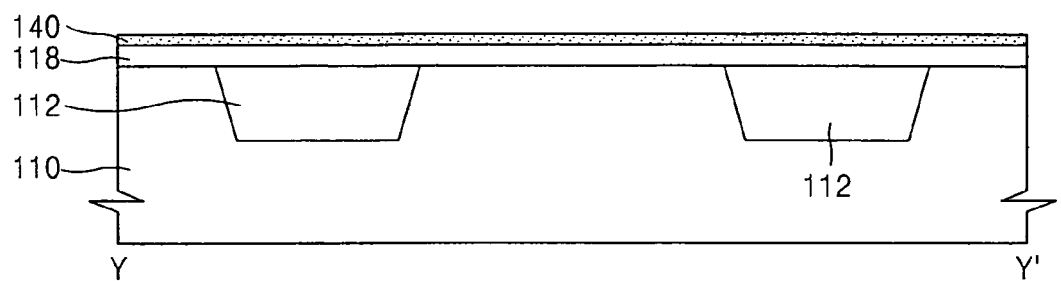

Referring to FIG. 4, silicon epitaxial layer 118 and coupling insulating film 140 are sequentially formed on bulk silicon substrate 110. Since silicon epitaxial layer 118 forms the channel region of the transistor, it is typically formed only on active region 111 and not on device isolation region 113. In order to form silicon epitaxial layer 118 only on active region 111, a film is grown-up on an entire surface of bulk silicon substrate 110 using a general Silicon Epitaxial Growth (SEG) method, and then any unnecessary portion(s) of the grown-up film are selectively etched away using a photolithography process.

After silicon epitaxial layer 118 is formed, coupling insulating film 140 is typically formed using silicon oxide. In general, coupling insulating film 140 is formed by growing up a thermal oxidation film on at least an entire surface of silicon epitaxial layer 118 using a conventional thermal oxidation process. Coupling insulating film 140 is preferably formed to have a smaller thickness than the gate oxidation film of the split gate transistor in FIG. 2B.

Figure 5:
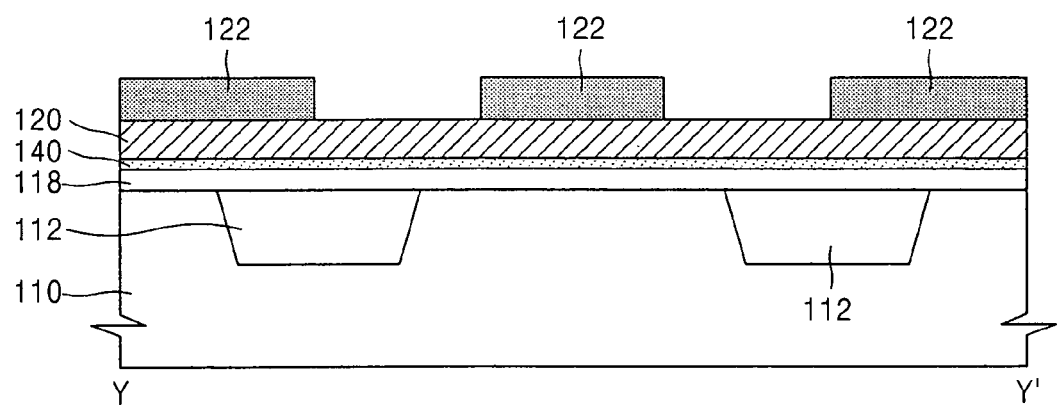

Referring to FIG. 5, a first polysilicon film 120 is deposited on coupling insulating film 140 in order to form the floating gate (120a in FIG. 2). A hard mask is formed on first polysilicon film 120 and the hard mask is patterned to form a hard mask pattern 122. Hard mask pattern 122 is generally formed using a material having a large etch selectivity relative to the polysilicon film and the silicon oxide film. For example, hard mask pattern 122 is typically formed using the silicon nitride film. Hard mask pattern 122 exposes first polysilicon film 120 in a region where floating gate 120a is to be formed.

Figure 6:
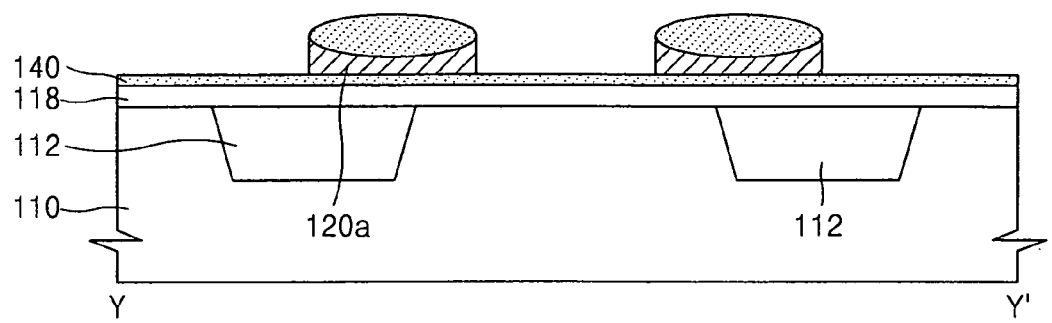

Referring to FIG. 6, floating gate 120a is formed. In order to form floating gate 120a, the thermal oxidation process is performed on the substrate having hard mask pattern 122. As a result of performing the thermal oxidation process, portions of first polysilicon film 120 exposed through hard mask pattern 122 are oxidized to form an oval-shaped oxide film, i.e., inter-gate insulating film 125 on first polysilicon film 120. Hard mask pattern 122 is then removed using a conventional process. First polysilicon film 120 is then etched using inter-gate insulating film 125 as an etching mask. By etching first polysilicon film 120, floating gate 120a is formed under inter-gate insulating film 125.

Figure 7:
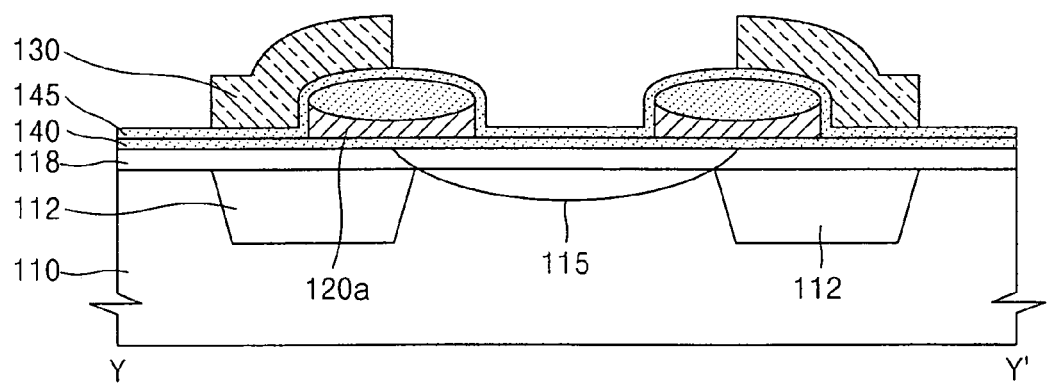

Referring to FIG. 7, tunneling insulating film 145, source region 115 and control gate 130 are formed. Tunneling insulating film 145 is formed using silicon oxide. Tunneling insulating film 145 typically comprises a dual film comprised of a silicon oxide film formed using the thermal oxidation process or a chemical vapor deposition (CVD) oxidation film formed using a CVD process. According to selected embodiments of the present invention, forming tunneling insulating film 145 comprises forming a first tunneling insulating film on an entire surface of the bulk silicon substrate having the floating gate and an inter-gate insulating film formed thereon using a thermal oxidation process and forming a second tunneling insulating film on the first tunneling insulating film using CVD. The silicon oxide film and the CVD oxidation film are formed using conventional techniques.

Bulk silicon substrate 110 is then masked with a photoresist pattern except in a portion where source region 115 is to be formed. Once bulk silicon substrate 110 is masked, an ion implantation process is performed to form source region 115. In cases where bulk silicon substrate 110 is p-type, phosphorus (P) or arsenic (As) ions are usually implanted by the ion implantation process. After ions are implanted into a predetermined region of bulk silicon substrate 110 and silicon epitaxial layer 118, a heat treatment is performed to diffuse the implanted ions. The heat treatment allows a portion of source region 115 to overlap with floating gate 120a as shown in FIG. 7.

A second polysilicon film or a conductive film such as a metal film is formed on bulk silicon substrate 110 following the heat treatment. The second polysilicon film or conductive film is patterned to form control gate 130 shown in the drawings.

According to selected embodiments of the invention, a process for forming a spacer (150 in FIG. 2B) is then performed. As previously mentioned, the process for forming spacer 150 is usually performed in cases where the flash memory device is merged with a logic device. The process for forming spacer 150 is also performed in many cases where the design rule gets smaller and the source/drain region of the flash memory device is manufactured with a Lightly Doped Drain (LDD) structure.

The ion implantation process is performed to form drain region 135 before or after the spacer forming process is performed. The ion implantation process used to form drain region 135 typically uses phosphorus (P) or arsenic (As) ions. In order to form drain region 135, a photoresist pattern is formed on bulk silicon substrate 110. The photoresist pattern exposes a portion of bulk silicon substrate where drain region 135 is to be formed and the ions are implanted into bulk silicon substrate 110 and silicon epitaxial layer 118 through the exposed portion.

Control gate 130 and spacers 150 are used as a mask to remove portions of insulating film 140 formed at least on source region 115 and drain region 135. Once portions of insulating film 140 are thus removed, the split gate type flash memory device as shown in FIG. 2B is completed.

As described above, a disturbance-preventing insulating film is formed between source and drain regions of a split gate type flash memory device. Accordingly, even though a high voltage is applied to a source region during a programming operation, punch-through caused by extension of a depletion area is prevented. As a result, the disturbance problem is prevented.

Furthermore, since the disturbance-preventing insulating film is typically formed in association with the STI forming process, manufacture processes are simplified.

While the present invention has been described with reference to exemplary embodiments thereof, those of ordinary skill will understand that various changes in form and details may be made therein without departing from the scope of the present invention as defined by the following claims.

What is claimed is:

1. A split gate type flash memory device comprising:
    a bulk silicon substrate having an active region defined by a device-isolating insulating film;
    a silicon epitaxial layer formed on the bulk silicon substrate;
    a source region and a drain region formed in the bulk silicon substrate and the silicon epitaxial layer;
    a channel region formed in the silicon epitaxial layer between the source region and the drain region;
    a disturbance-preventing insulating film formed in the bulk silicon substrate between the source region and the drain region; and,
    a gate structure formed on the bulk silicon substrate.

2. The device of claim 1, wherein the gate structure comprises:
    a coupling insulating film formed on the silicon epitaxial layer;
    a floating gate formed on the coupling insulating film overlapping an outer portion of the source region;

a control gate overlapping a portion of the floating gate opposite the source region, and extended toward the drain region;

an inter-gate insulating film formed between the floating gate and the control gate; and, a tunneling insulating film interposed between the floating gate and the control gate.

3. The device of claim 1, wherein the source region and the drain region are isolated from each other by the disturbance-preventing insulating film.

4. The device of claim 3, wherein the disturbance-preventing insulating film and the device-isolating insulating film are formed concurrently.

5. The device of claim 4, wherein the device-isolating insulating film is a Shallow Trench Isolation (STI) film.

6. The device of claim 3, wherein the disturbance-preventing insulating film and the device-isolating insulating film are connected to each other.

7. The device of claim 1, wherein the silicon epitaxial layer is formed only in the active region of the bulk silicon substrate.

8. The device of claim 1, wherein the inter-gate insulating film comprises an oval-shaped oxide film.

9. The device of claim 1, further comprising:

a spacer formed on sidewalls of the control gate and on the tunneling insulating film of the floating gate closest to the source region.

10. The device of claim 1, wherein the disturbance-preventing insulating film comprises an insulating material such as silicon oxide, silicon nitride, silicon oxide nitride, or a combination thereof.

11. The device of claim 1, wherein the disturbance-preventing insulating film is formed of the same material as the device-isolating insulating film.

* * * * *